US008358186B1

(12) United States Patent
Tsironis

(10) Patent No.: US 8,358,186 B1

(45) Date of Patent: Jan. 22, 2013

(54) IMPEDANCE TUNERS WITH RESONANT PROBES

(76) Inventor: Christos Tsironis, Kirkland (CA)

( * ) Notice: Subject to any disclaimer, the term of this patent is extended or adjusted under 35 U.S.C. 154(b) by 134 days.

(21) Appl. No.: 12/662,981

(22) Filed: May 14, 2010

(51) Int. Cl.
*H03H 7/38* (2006.01)

(52) U.S. Cl. ...................................... 333/263; 333/17.3

(58) Field of Classification Search .................... 333/33, 333/17.3, 263
See application file for complete search history.

(56) References Cited

U.S. PATENT DOCUMENTS

| | | | | |
|---|---|---|---|---|
| 6,297,649 | B1 | 10/2001 | Tsironis | |
| 6,674,293 | B1 | 1/2004 | Tsironis | |
| 7,248,866 | B1 | 7/2007 | Tsironis | |
| 7,595,709 | B1 * | 9/2009 | Boulerne | 333/263 |

OTHER PUBLICATIONS

"Product Note #41: Computer Controlled Microwave Tuner, CCMT", Focus Microwaves Inc., Jan. 1998.

"Harmonic Effects in Load Pull using wideband Tuners", application note 56, Focus Microwaves Inc., Aug. 2003.

* cited by examiner

*Primary Examiner* — Stephen Jones

(57) ABSTRACT

Slide screw impedance tuners use resonant probes in order to avoid uncontrollable reflection factors at harmonic frequencies in high power load pull transistor testing. The tuners use either coaxial slotted airlines or slablines. The probes are coupled capacitively with the central conductor of the airline and are either slotted with associated spring loaded effect for better galvanic ground contact, or solid dielectrically coated or anodized and carefully machined for slide fitting into the slabline opening or the coaxial line slot, for capacitive contact with the ground plane. The probes allow for selective reflection behavior over a given frequency range, which does not include unwanted frequencies, such as harmonic or sub-harmonic frequencies.

28 Claims, 20 Drawing Sheets

Slotted resonant probe in parallel plate airline (slabline)

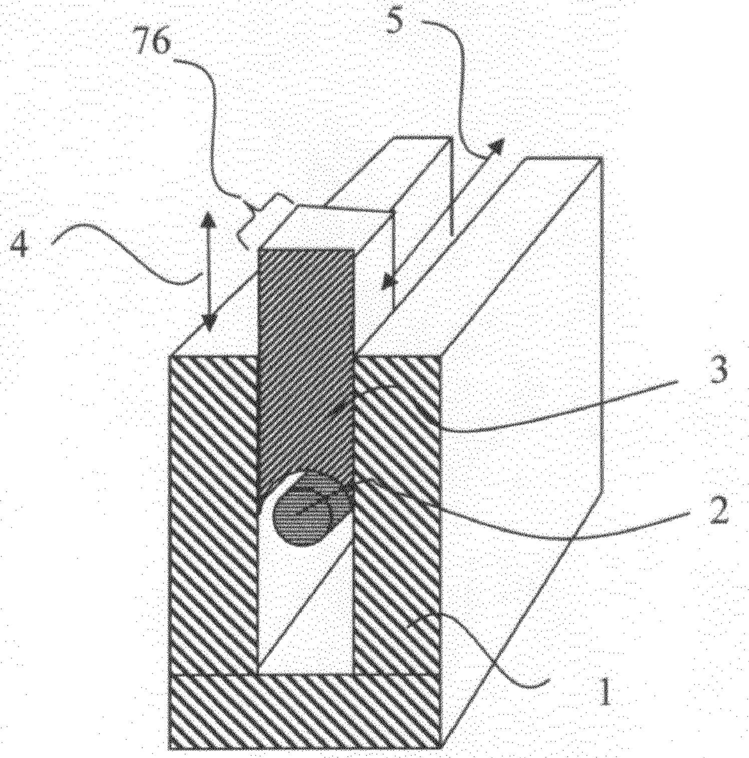
Figure 1: Prior art: cross section of slide screw tuner with parallel-plate slabline

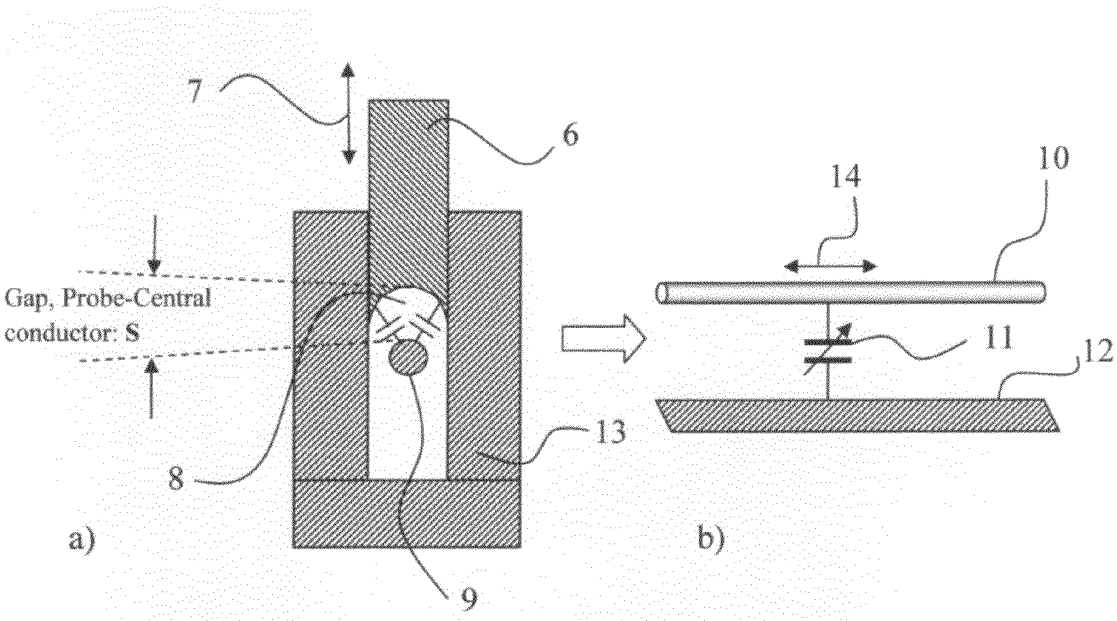
Figure 2: Prior art: Capacitive effect of probe in slide screw tuner and electrical equivalent

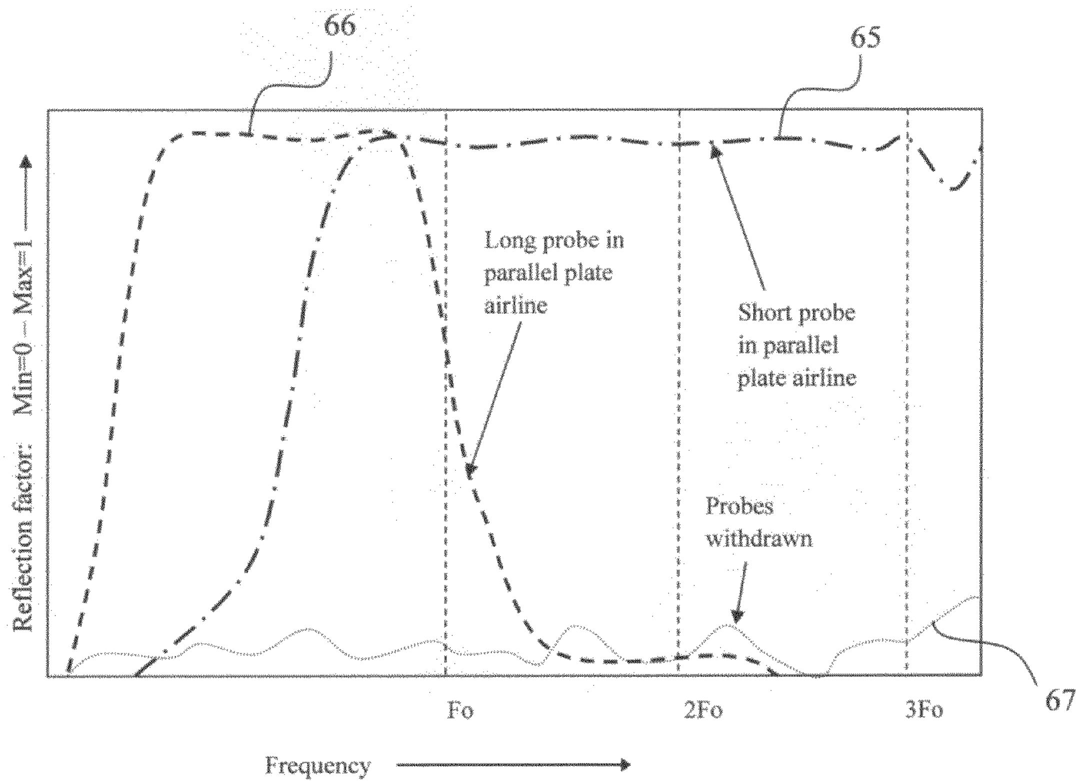
Figure 3, prior art: Typical frequency response of reflection factor of short and long probes in a slabline; "short" and "long" refer to horizontal axis direction

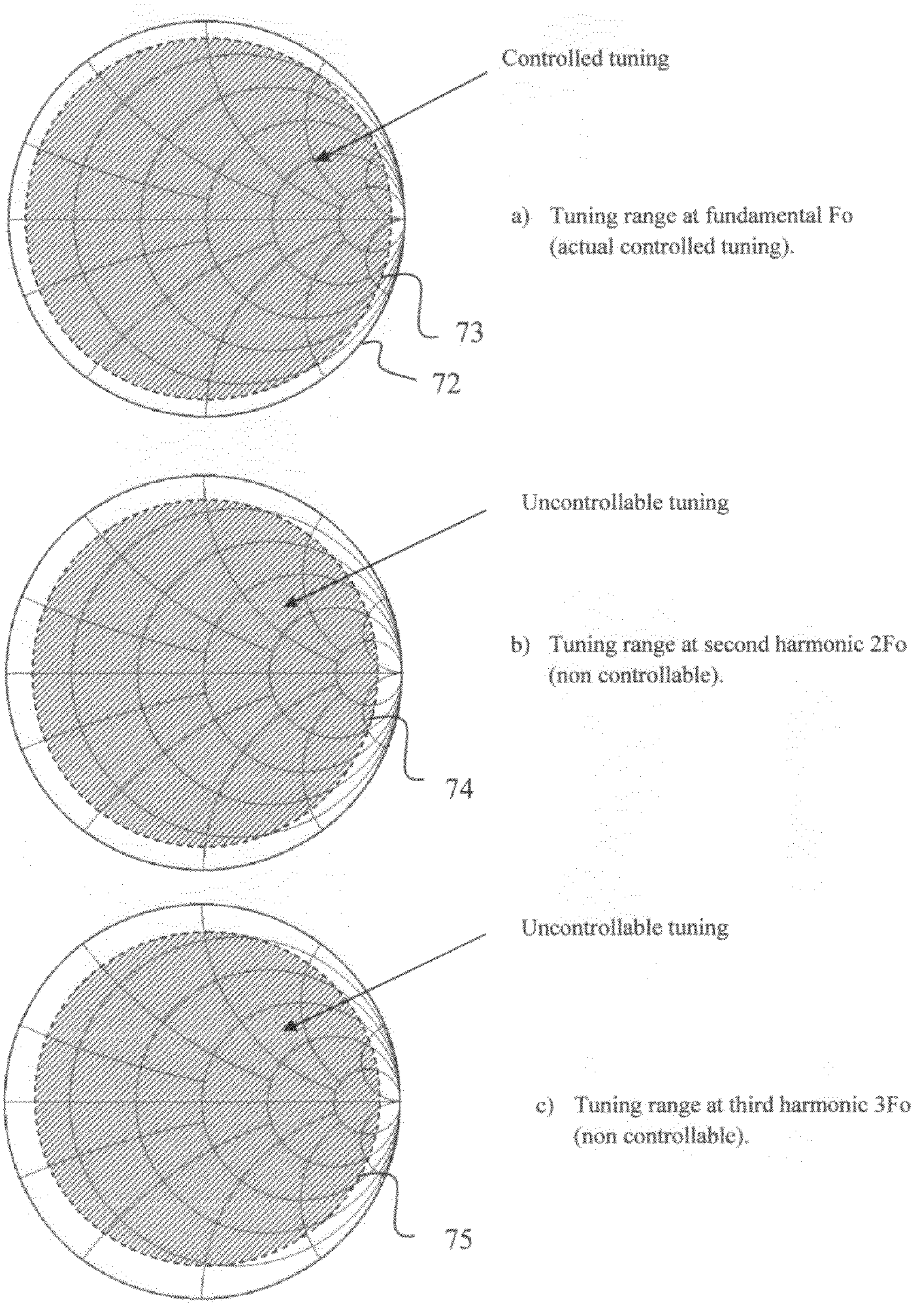
Figure 4: Prior art, non-controllable tuning of parallel plate airline tuner at harmonic frequencies

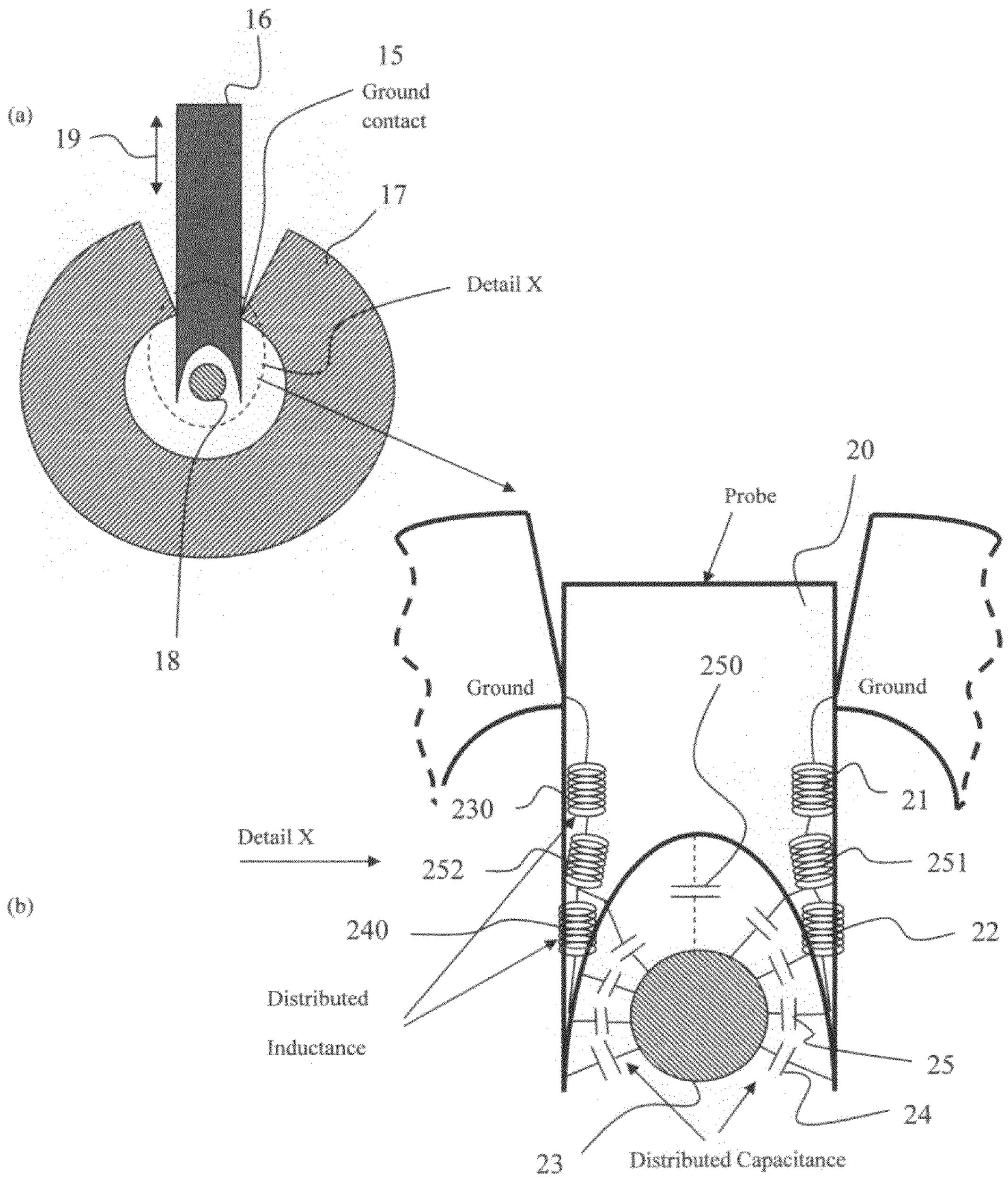
Figure 5: Cross section (a) of resonant wideband probe showing (b) capacitance and inductance effects

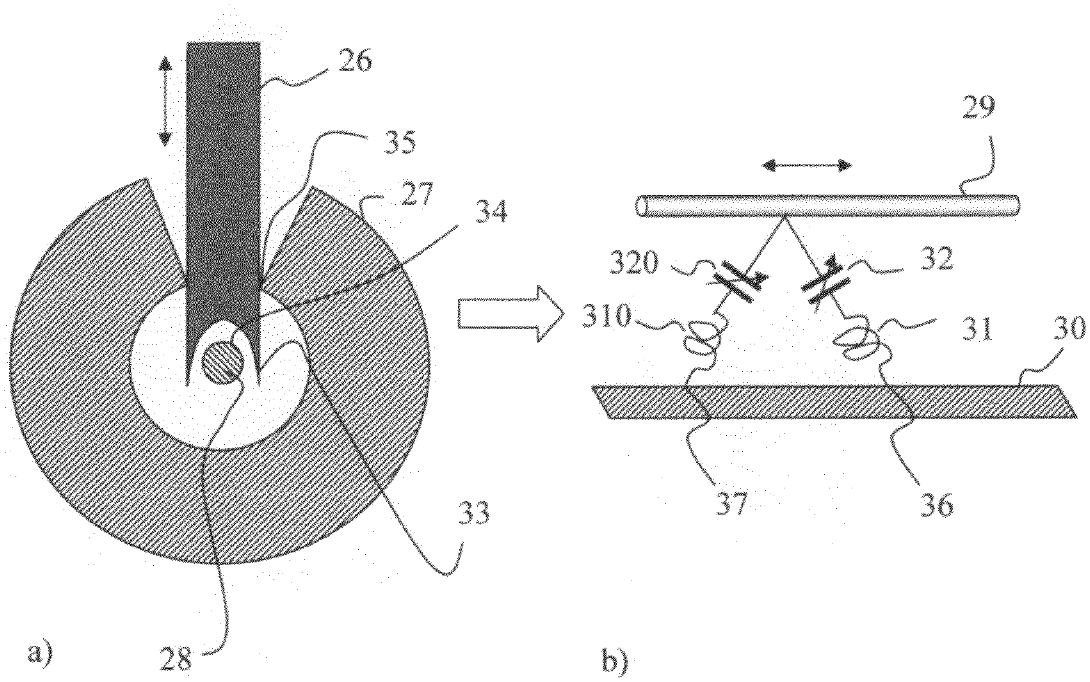
Figure 6: Electrical equivalent circuit of resonant wideband probe

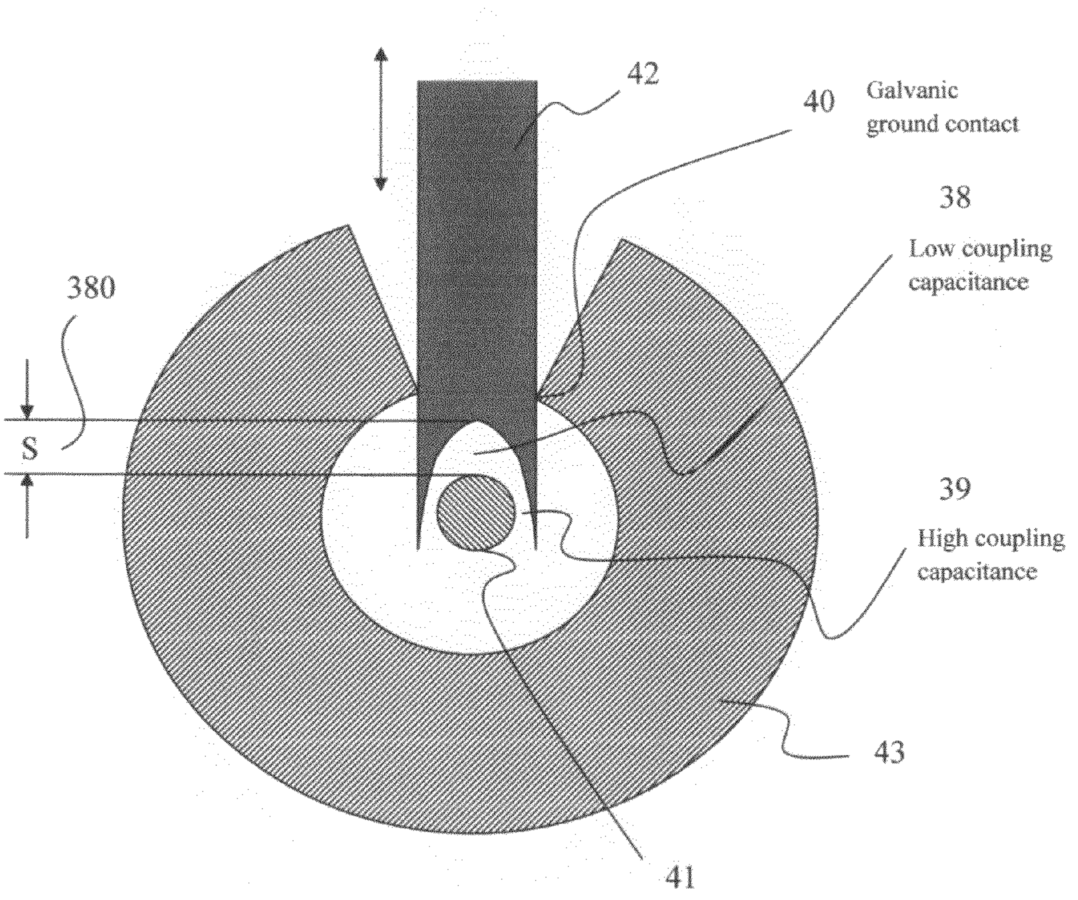
Figure 7: Cross section of slotted coaxial transmission line with solid probe and long tails

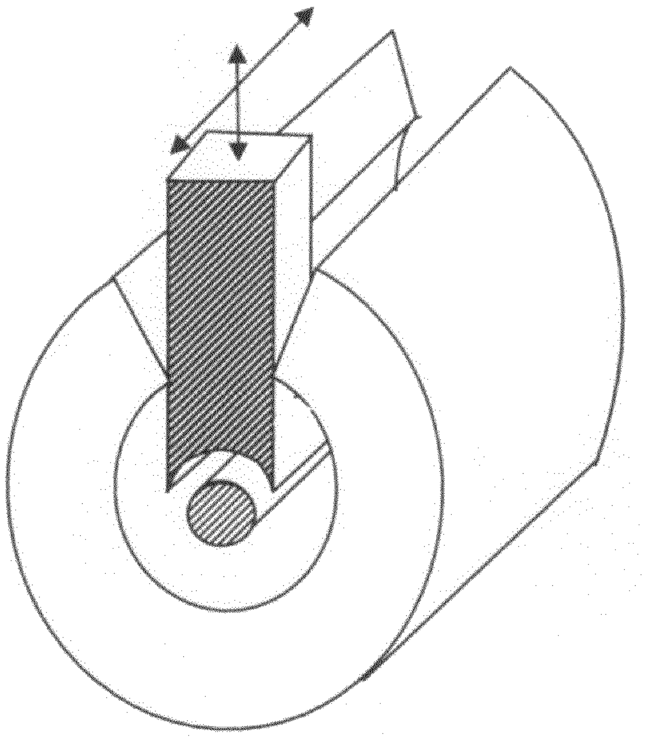
Figure 8: Cross section of slotted coaxial airline with solid probe

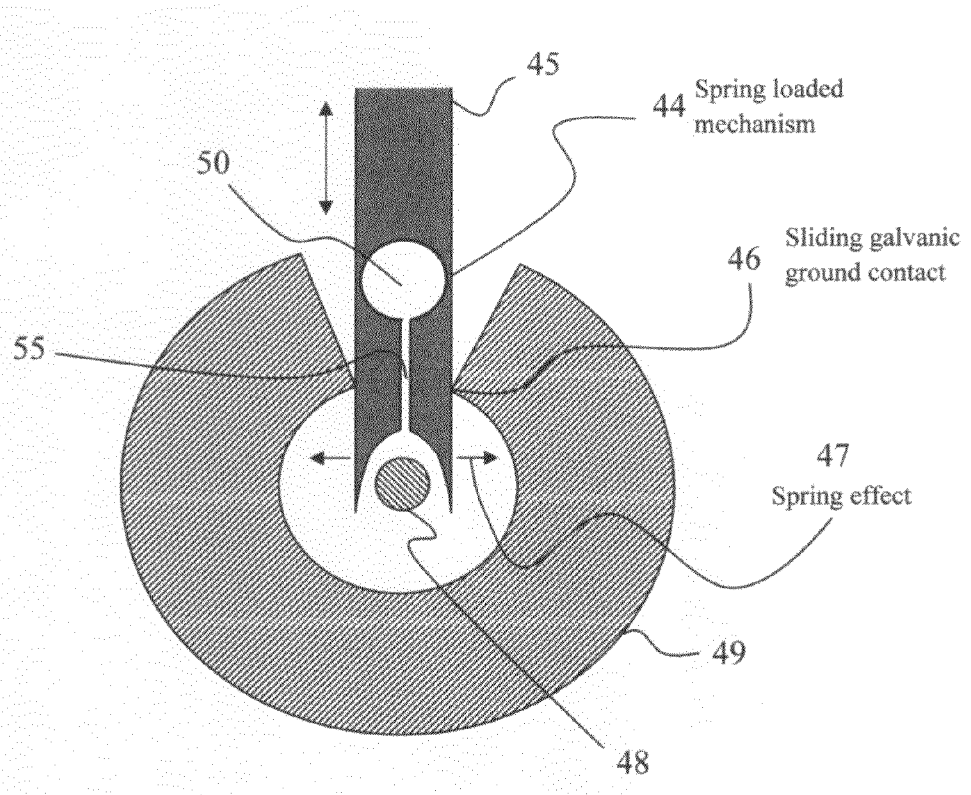
Figure 9: Cross section of slotted wideband resonant probe with spring loaded ground contact

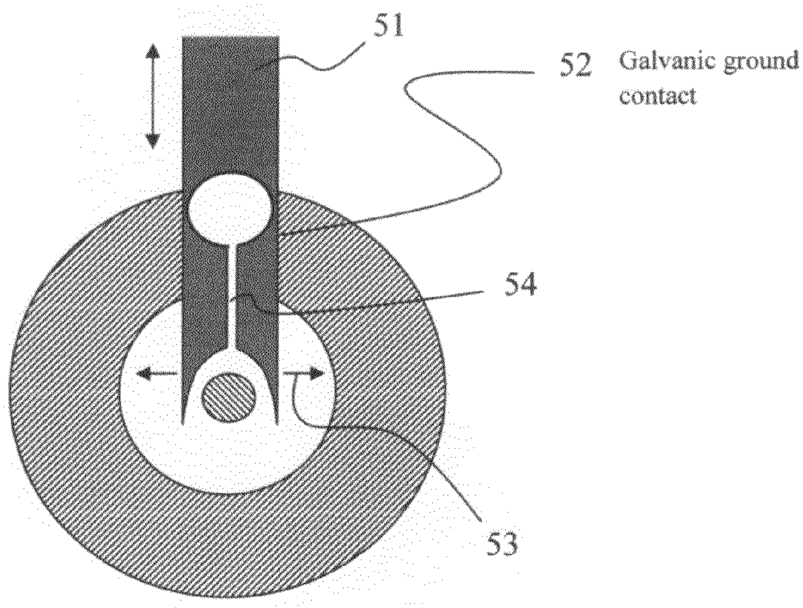
Figure 10: Coaxial airline, slotted vertically, for large galvanic contact with spring-loaded probe

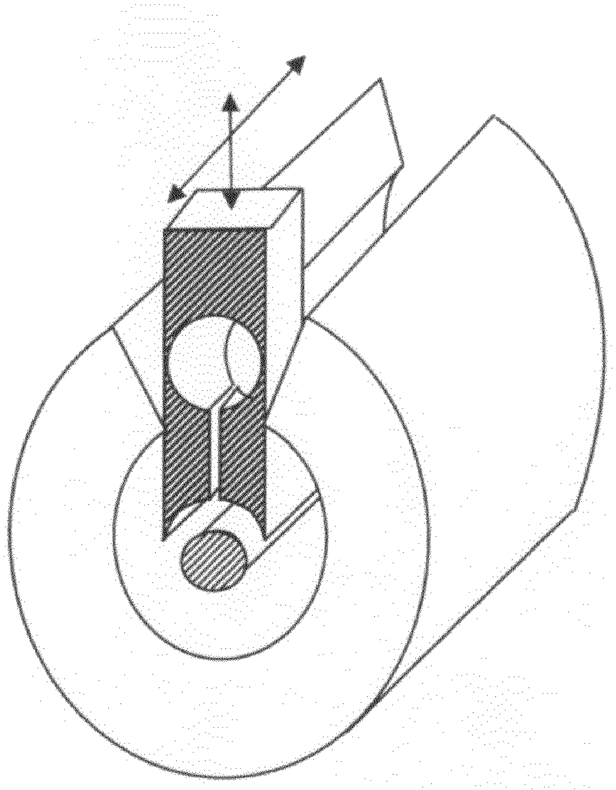
Figure 11: Cross section of slotted coaxial airline with slotted probe

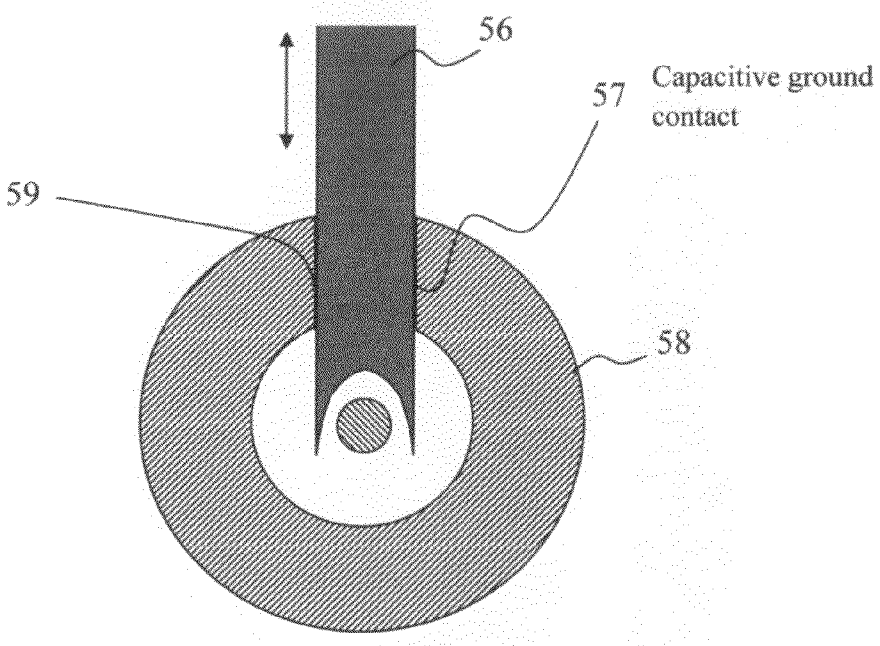
Figure 12: Coaxial airline, slotted vertically for capacitive ground contact with solid probe

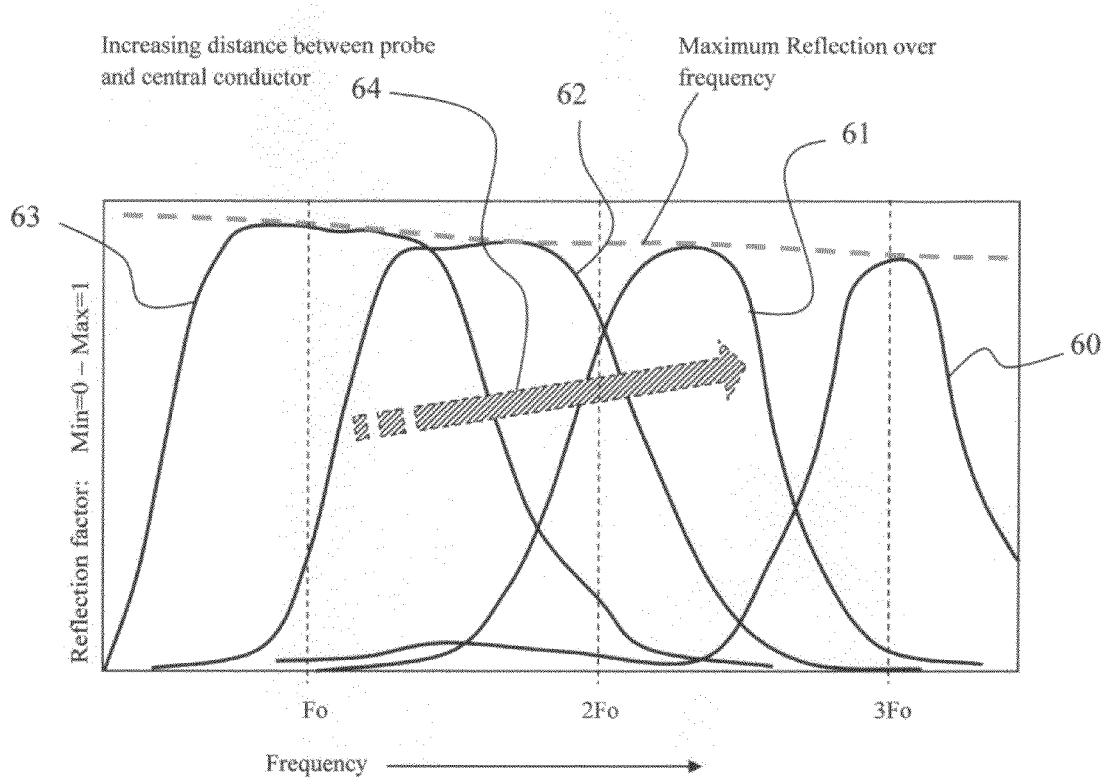
Figure 13: Frequency response of reflection factor of resonant probe in coaxial airline, with increasing space between probe and central conductor

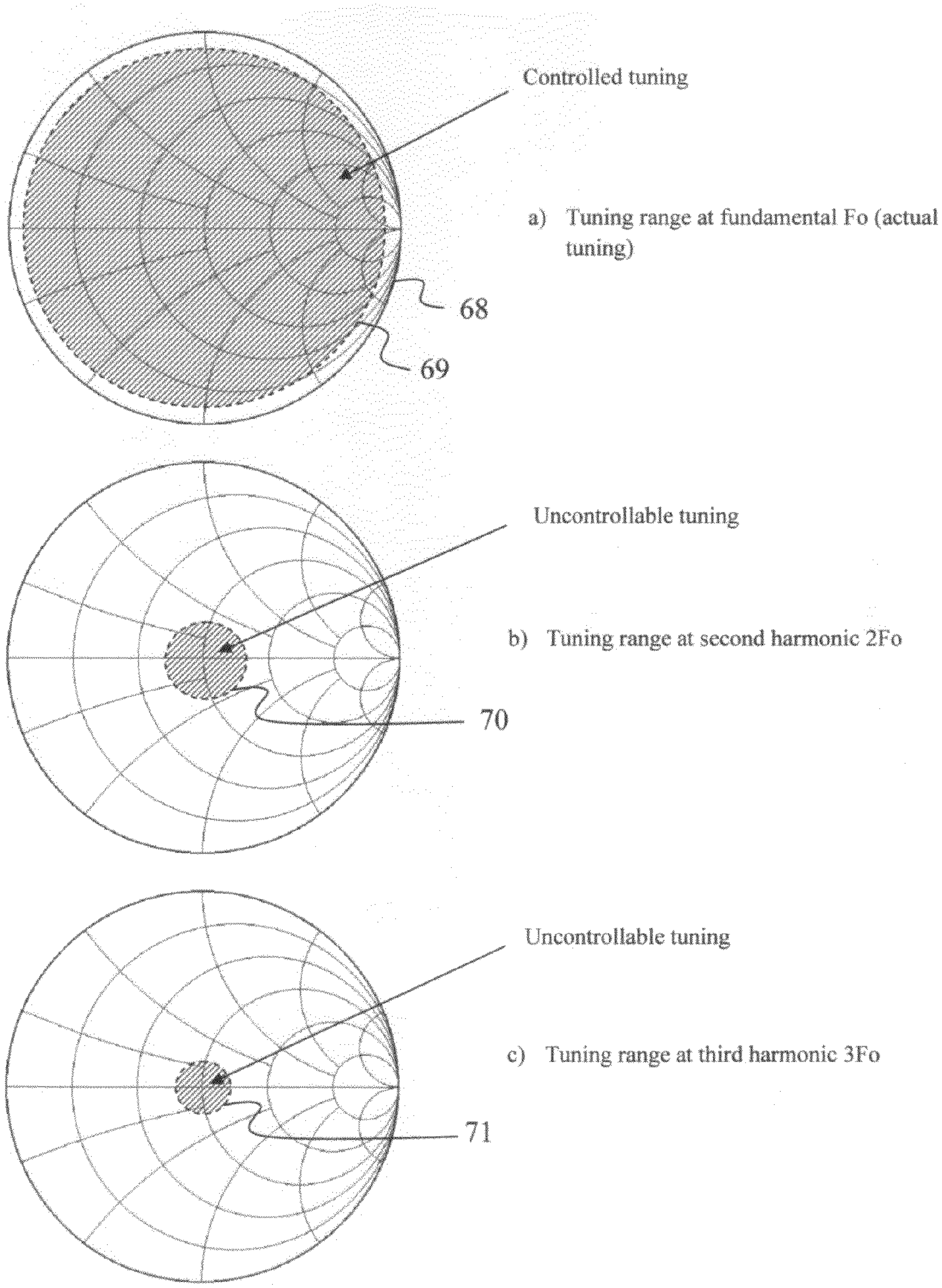
Figure 14: Tuning range of coaxial airline tuner at harmonic frequencies

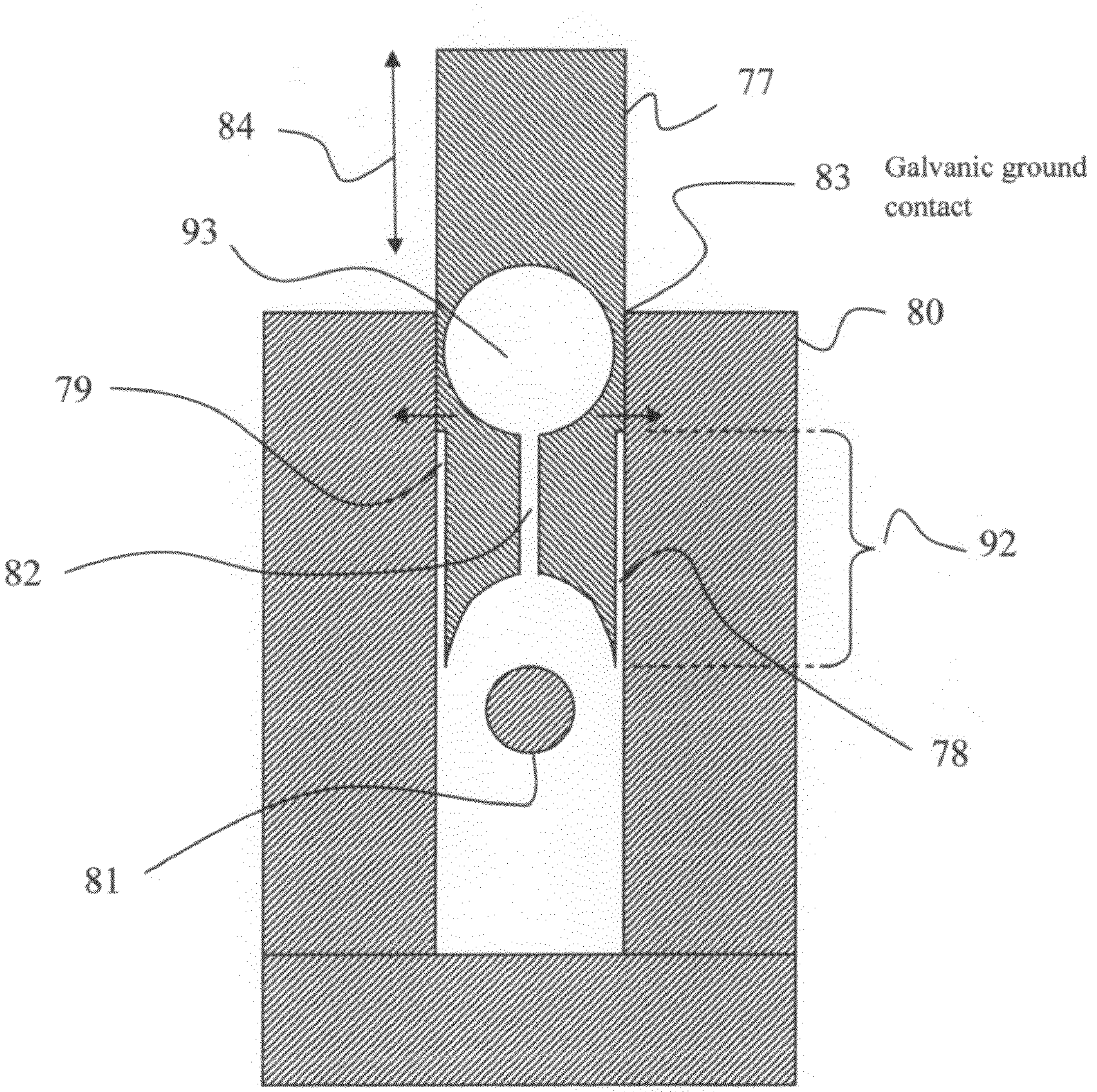
Figure 15: Slotted resonant probe in parallel plate airline (slabline)

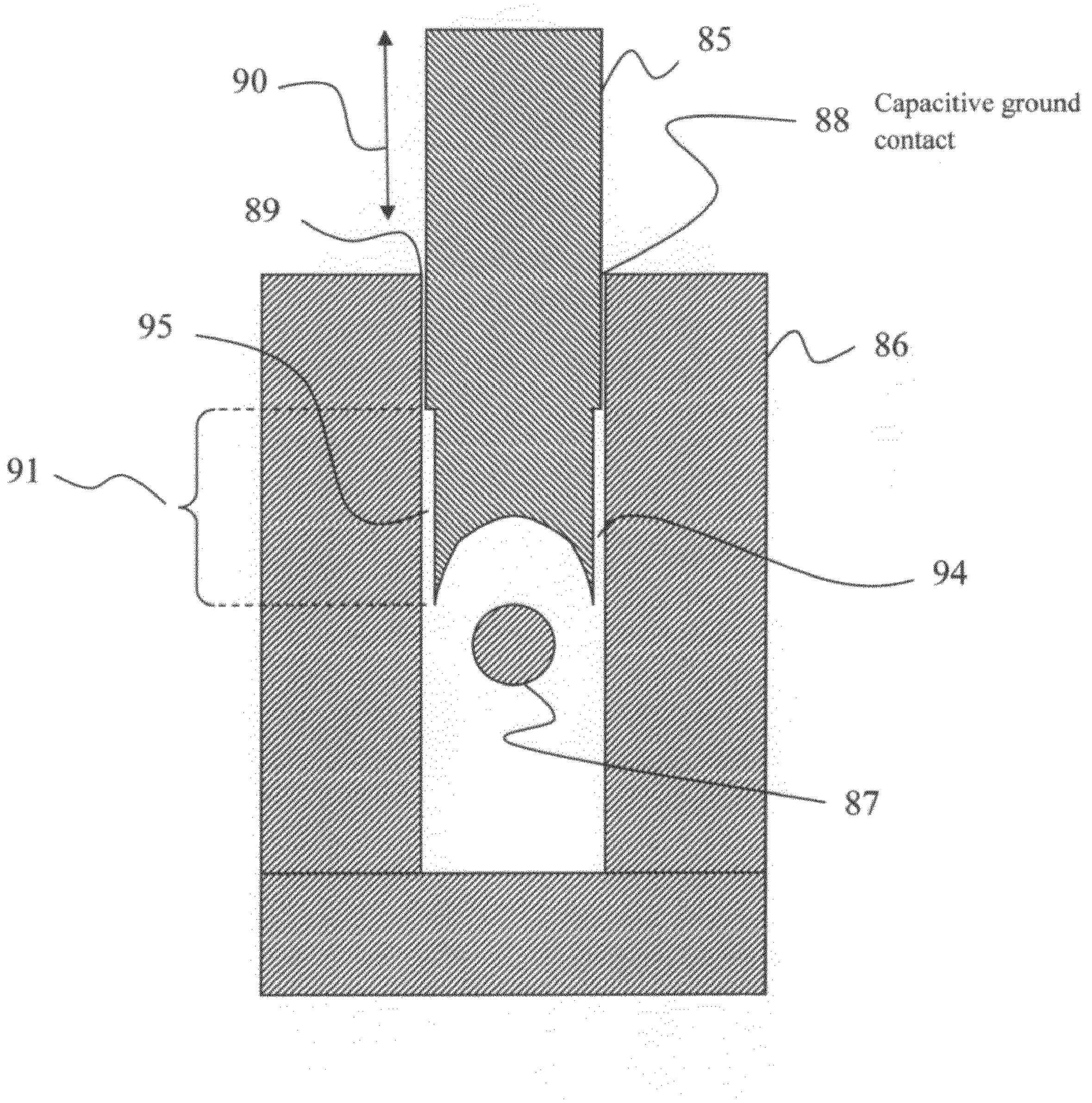
Figure 16: Solid resonant probe in parallel plate airline (slabline)

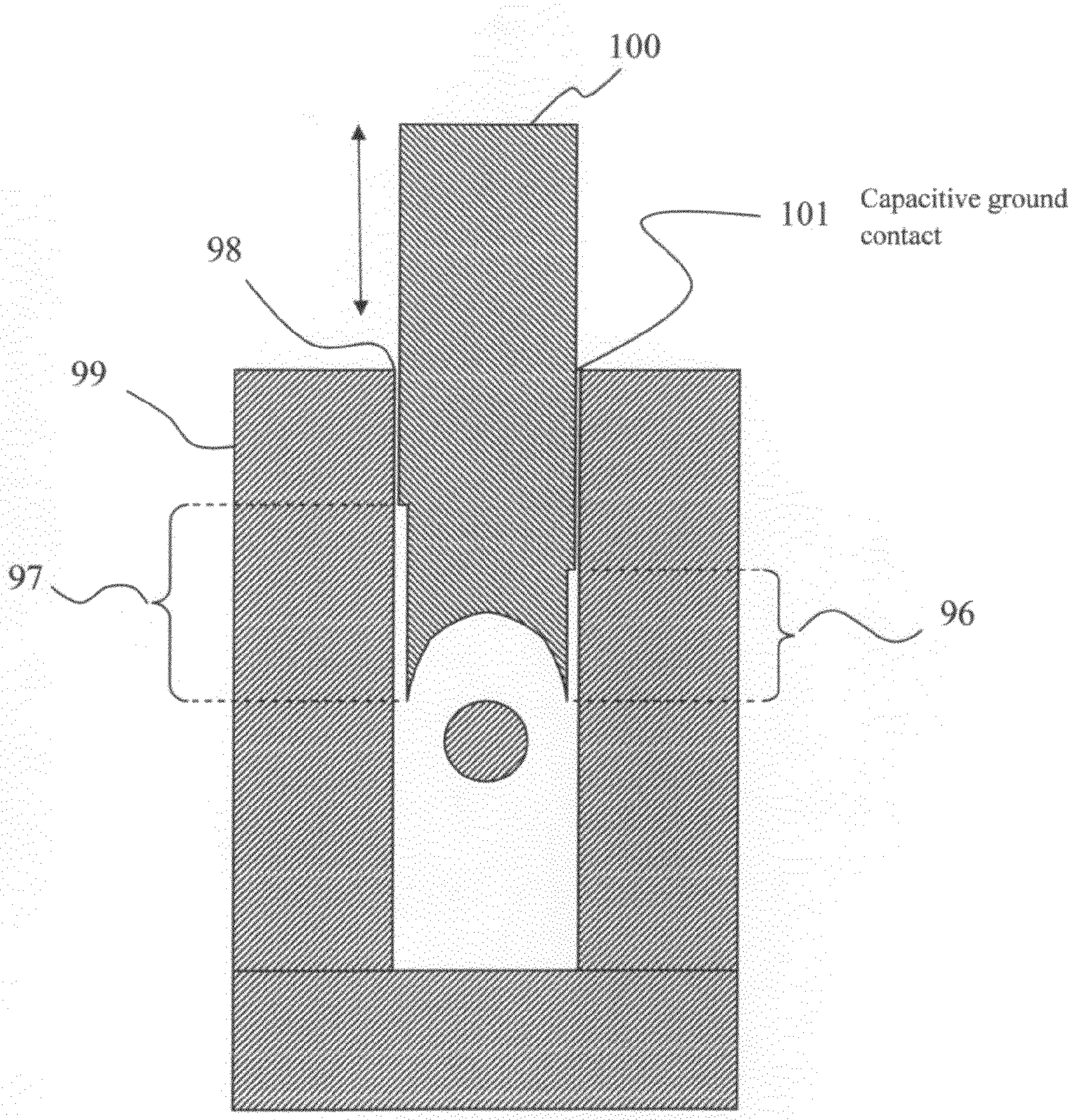
Figure 17: Solid resonant probe in parallel plate airline (slabline) with different side gaps

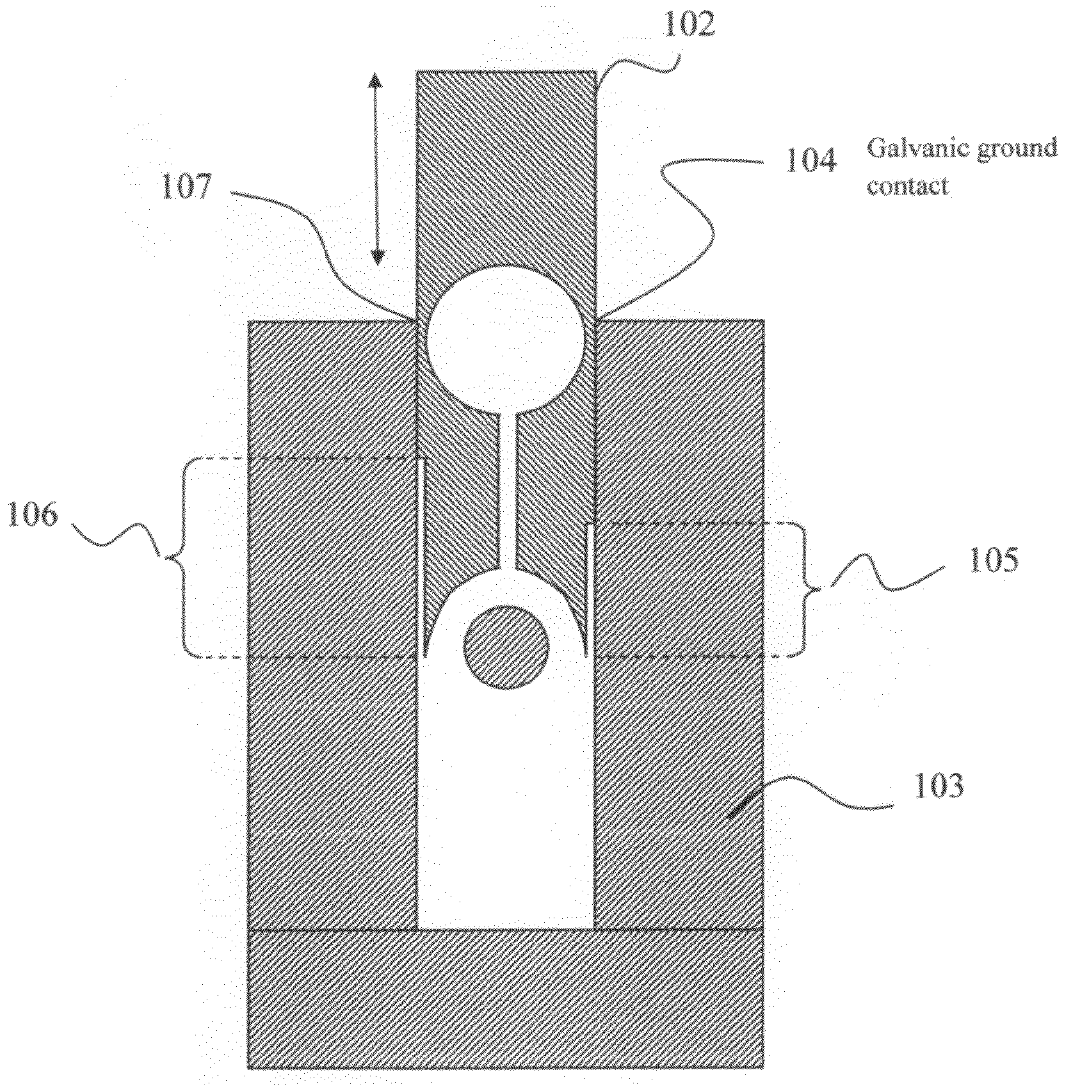
Figure 18: Spring loaded (slotted) resonant probe in parallel plate airline (slabline) with different side gaps

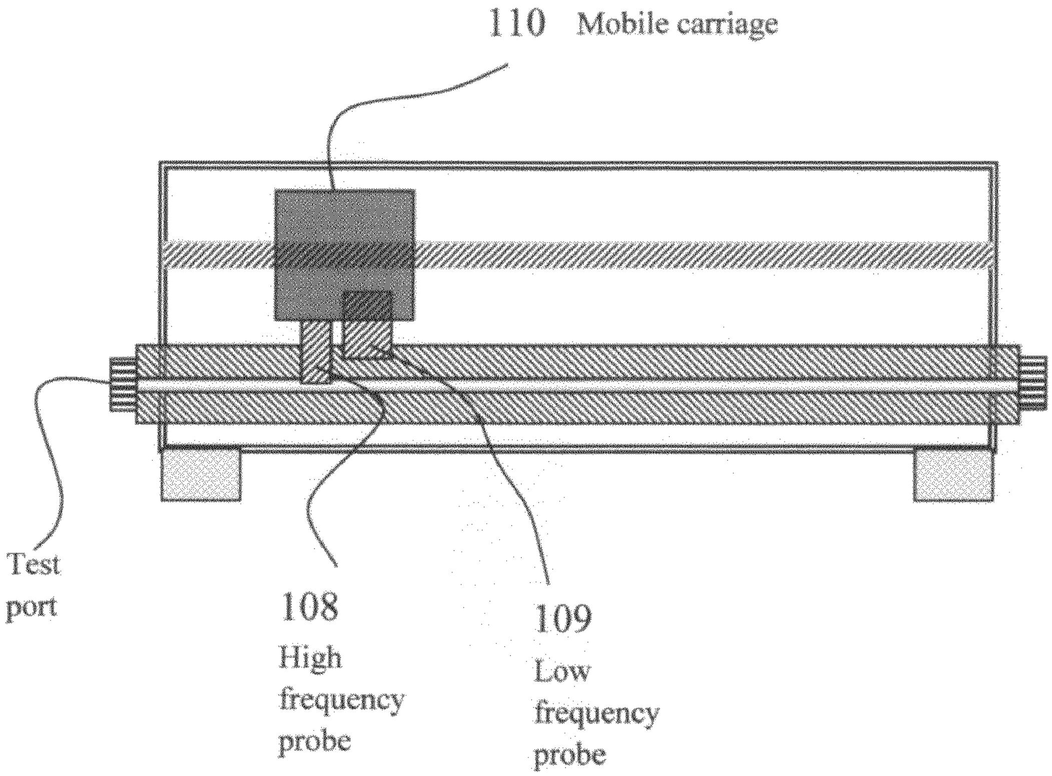
Figure 19: Schematics of impedance tuner using resonant wideband probes

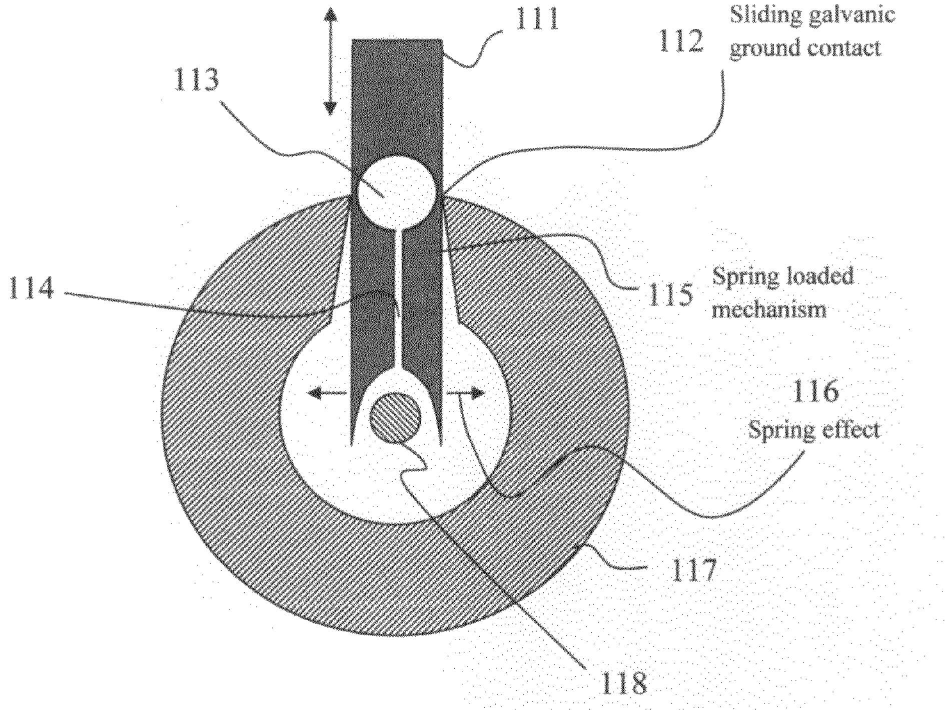
Figure 20: Cross section of slotted wideband resonant probe with wide opening towards the inside wall of the airline.

IMPEDANCE TUNERS WITH RESONANT PROBES

PRIORITY CLAIM

Not Applicable

CROSS-REFERENCE TO RELATED ARTICLES

[1] "Product Note #41: Computer Controlled Microwave Tuner, CCMT", Focus Microwaves Inc., January 1998

[2] "Harmonic Effects in Load Pull using wideband Tuners", application note 56, Focus Microwaves Inc., August 2003

[3] C. Tsironis, "Frequency selective load pull tuner and method", U.S. Pat. No. 7,248,866

[4] C. Tsironis, "Harmonic Rejection Load Tuner", U.S. Pat. No. 6,297,649

[5] C. Tsironis, "Adaptable pre-matched tuner system and method", U.S. Pat. No. 6,674,293

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to microwave transistor testing using automatic microwave impedance tuners in order to synthesize reflection factors (or impedances) at the input and output of said transistors.

Impedance tuners at RF and microwave frequencies are based, in most cases, on the slide-screw principle (FIG. 1). Such tuners comprise a low loss parallel plate transmission line (slabline, (1)) and metallic probes (slugs, (3)), which are inserted (4) into the slabline (1) and create adjustable reflection factors when approached to the central conductor (2) of said slabline (1). Capacitive coupling between said probes (slugs) and central conductor is the main cause for reflection of the electromagnetic waves travelling across the slabline. Said probes (3) are also movable in horizontal direction (5), parallel to the central conductor (2) of said slabline and allow changing also the phase of said reflection factor at RF frequencies. The area (73) on a Smith chart (72) which can be reached by the reflection factor of said impedance tuners (FIG. 4*a*) is called tuning range. The Smith chart is a polar representation of electrical impedances Z=R+jX, using a reflection factor T=(Z−Zo)/(Z+Zo), where Zo is the characteristic impedance of the transmission media, in our case 50 Ohms. The tuning range is important if transistors with very low or very high internal impedance need to be tested. The characteristic impedance of said Smith chart being 50 Ohms a tuner capable of creating reflection factors of 0.9 can reach impedances between a minimum of 2.6 Ohms and a maximum of 950 Ohms.

The electrical field distribution inside a slide screw tuner is shown simplified in FIG. 2*a*). A capacitive coupling (8) exists between the central conductor (9) and ground, which in this case is the slabline itself (13). As the probe (6) moves up and down (7) said capacitive coupling decreases and increases correspondingly. FIG. 2*b*) shows an electrical equivalent of said capacitive coupling, represented by a capacitor (11) between the center conductor (10) and ground (12). Said capacitor (11) can move horizontally (14) as well.

Reducing the distance (8) between probe and central conductor (9) increases the capacitance (11) and the amplitude of the reflection factor. Moving the probe across the axis of the slabline (14, parallel to the central conductor) changes the phase of the reflection factor.

This type of tuner (FIGS. 1 and 2) has a typical frequency response of the reflection factor as shown in FIG. 3; here trace (65) shows the maximum reflection obtainable when a short probe is used. Trace (66) shows said maximum reflection when a long probe is used. Short and long terms are used here to describe the size of said probes in direction of the central conductor of said slabline (76, FIG. 1). Said slabline is described here as a parallel plate airline. Trace (67) shows the reflection factor of said slide screw tuner when both probes are withdrawn from the slabline. FIG. 3 also shows three vertical traces marked Fo, 2Fo and 3Fo. Said traces mark the fundamental, second and third harmonic of the frequency (Fo) at which the tuner is used. In this case the short probe is used (trace 65), which creates sufficient reflection at Fo. As can be seen there is an important reflection at all said frequencies (Fo to 3Fo). Because only the reflection factor at Fo is controlled by the system software, however, the reflection factors at 2Fo and 3Fo are uncontrollable. This is a major disadvantage of such wideband impedance tuners, using parallel plate airlines (or slablines) [2]. The long probe does not create high reflection at 2Fo and 3Fo, but it cannot be used in this case, since it does not create enough reflection at Fo either. The tuning range inside a Smith chart (72) at the fundamental (73) and harmonic (74, 75) frequencies of a tuner using probes as in FIGS. 1 and 2 is shown in FIGS. 4*a*), *b*) and *c*).

A practical way of avoiding this phenomenon of uncontrollable harmonic tuning, beyond the method of using additional harmonic rejection tuners [2], is to use resonant probes. Resonant probes can be non-contacting [3] or contacting the central conductor [4]. Contacting resonant probes have been used before in harmonic rejection tuners [4]. However the probes in [4] do contact the central conductor, not the ground plane of the airline, create a high reflection at harmonic frequencies and do not allow adjustment of the amplitude of the reflection factor. This invention describes resonant probes for avoiding this side effect.

SHORT DESCRIPTION OF THE DRAWINGS

The invention and its mode of operation will be better understood from the following detailed description when read with the appended drawings in which:

FIG. 1 depicts prior art: Cross section of slide screw tuner with parallel-plate airline, also called 'slabline'.

FIG. 2 depicts prior art: Capacitive effect of probe in slide screw tuner and electrical equivalent thereof.

FIG. 3 depicts prior art: Typical frequency response of reflection factor of short and long probes in traditional parallel plate airline (or slabline); "short" and "long" refer to the size of the probe in direction of the horizontal axis.

FIG. 4 depicts prior art: Non-controllable tuning of parallel plate airline slide screw tuner at harmonic frequencies.

FIG. 5 depicts: Cross section (a) of resonant wideband probe, showing (b) capacitance and inductance effects.

FIG. 6 depicts: Electrical equivalent circuit of resonant wideband probe.

FIG. 7 depicts: Cross section of slotted coaxial transmission line with solid probe and long tails.

FIG. 8 depicts: Cross section of slotted coaxial airline with solid probe.

FIG. 9 depicts: Cross section of slotted wideband resonant probe with spring loaded ground contact.

FIG. 10 depicts: Coaxial airline, slotted vertically, for large galvanic contact with spring-loaded probe.

FIG. 11 depicts: Cross section of slotted coaxial airline with slotted probe.

FIG. 12 depicts: Coaxial airline, slotted vertically for capacitive ground contact with solid probe.

FIG. 13 depicts: Frequency response of reflection factor of resonant probe in coaxial airline, with increasing space between probe and central conductor.

FIG. 14 depicts: Tuning range of coaxial airline tuner with resonant probes at harmonic frequencies.

FIG. 15 depicts: Slotted resonant probe in parallel plate airline (slabline).

FIG. 16 depicts: Solid resonant probe in parallel plate airline (slabline).

FIG. 17 depicts: Solid resonant probe in parallel plate airline (slabline) with different side gaps.

FIG. 18 depicts: Spring loaded (slotted) resonant probe in parallel plate airline (slabline) with different side gaps.

FIG. 19 depicts: Schematics of impedance tuner using resonant wideband probes.

FIG. 20 depicts: Cross section of slotted wideband resonant probe with wide opening towards the inside wall of the airline.

DETAILED DESCRIPTION OF THE INVENTION

The new resonant probes are all capacitively coupled with the central conductor of the airline the same as hitherto non-resonant probes in existing slide screw impedance tuners [5, FIG. 11]. However said new probes use either galvanic or capacitive contact with the ground plane of either a slotted coaxial airline or a parallel plate slabline, other than previous resonant probes [3, 4]. Various configurations and cross sections of said resonant probes are shown in FIGS. 5 to 18.

In FIG. 5*a*), a solid resonant probe (16) slides inside a slot of the coaxial airline (17). Said probe (16) makes galvanic contact (15) with the metallic walls of said airline (17). Said probe (16) may move vertically (19) thus changing the capacitance between the central conductor (18) and ground (17). The RF electrical equivalent of the core detail (X) of said tuner structure is shown in FIG. 5*b*). The probe (20) is capacitively coupled with the central conductor (23). The capacitance is distributed (24, 25) but mostly concentrated sideways instead of on the top (250); the electric field is mostly concentrated towards the tails of the probe, because they are closer to the central conductor (23). The electrical signal travels through the probe's tails (251, 252) towards the ground plane. This creates a distributed inductance (21, 22, 23 and 240). This distributed LC structure has, in certain frequency ranges a resonant behaviour (FIGS. 6, 13). The resonance frequency of an LC structure is Fres=1/(2*pi*sqrt (L*C)) (equation {1}). When the probe (20) is further away from the central conductor (23) the capacitance C becomes smaller and the current path through the probe tails (251, 252) to ground becomes shorter, so do the associated distributed inductances L (230, 240, 21, 22, FIG. 5*b*). The resonance frequency thus rises, following equation {1}. This mechanism is shown in FIG. 13. Trace (63) is the reflection factor at the smallest distance (gap) between probe and central conductor (S, 380 in FIG. 7). Trace (62) is when the gap S becomes bigger (64), and continues until trace (60) when said gab S is highest. By increasing said gap S (FIG. 2) further the reflection finally disappears.

The electrical equivalent of said resonant probe (26) is shown in FIG. 6*b*). The probe (26) is capacitively (34) coupled to the central conductor (28) and the signal picked up by said probe (26) returns to ground (27) through the inductive tails (33) of said probe. This mechanism is equivalent to capacitances (32, 320) connected between the central conductor (29) and ground (30) at points (36, 37) via inductances (31, 310).

The resonance effect on tuning range is shown in FIG. 14: Whereas the tuning range at the fundamental frequency Fo (69) covers most of the Smith chart (68), at the harmonic frequencies 2Fo (70) and 3Fo (71) the tuning range is restricted around the center of said Smith chart, meaning that we have little uncontrolled tuning at the harmonic frequencies. This is a major advantage, since unwanted and uncontrolled harmonic tuning does falsify the measurement data, especially when testing transistors at high compression state [2].

A major issue in RF components with moving parts is uninterrupted contact. There are two types of RF contact: galvanic and capacitive. Galvanic contact suffers from varying contact resistance during movement and capacitive contact from change in coupling capacitance. In our case said contacts are between the probe and ground. FIGS. 5 to 8 show galvanic ground contact between a solid probe and airline walls (15, 35, 40). This is a sensitive solution, since it requires extremely precise manufacturing of the slot in said airline. It is used here essentially in order to demonstrate the concept of resonant probes in slotted coaxial airlines. The practical alternatives are shown in FIGS. 9 to 11, using a slotted probe and galvanic ground contact and in FIG. 12 using a solid probe and capacitive ground contact (57) between the airline (58) and the probe (56) inserted into the airline slot (59). Slotted probes (55, FIG. 9) provide for a permanent spring effect (44, 47) against the walls of the slotted airline (49) and thus reliable galvanic contact, even when the probe moves vertically and horizontally and the width of said slot changes, due to manufacturing imperfections. Additionally, the fact that slotted probes (FIG. 9) impose a narrower path to the current through the capacitance to ground than solid probes (FIG. 5) increases the associated inductance and thus reduces the resonance frequency of said probe (FIG. 13).

The resonance mechanism is further enhanced by making the inductive path of the signal coupled from the central conductor (118) through the probe (111) to ground (117) longer (FIG. 20). This is possible by machining the slot of the airline (117) with the bigger opening towards the outside ((112). The spring loaded mechanism (115, 116) remains the same as does the secured sliding galvanic ground contact (112). The hole (113) in the probe itself (111) is made slightly higher and the associated slot (114) longer in order to create appropriate spring effect (116). By increasing the probe inductance through the longer current path between center conductor (118) and ground (112) we lower the resonance frequency of said probe as indicated by equation {1}.

An alternative to spring loaded galvanic contact between slotted probe and ground is the use of capacitive ground contact (FIG. 12). In this case the coaxial airline is slotted vertically (59) (and not trapezoidal (slanted) as in FIGS. 5 to 11) and the solid probe (56) is dimensioned to slide-fit into said slot (59); said capacitive contact can be manufactured by hard anodizing the airline (58), or the probe (56) or both. Anodized surfaces are very thin, insulating and quite resistant and thus provide for reliable capacitive coupling. Alternative methods of dielectric coating of either the surface of said airline facing the probe or the probe itself, such as heat treated Teflon spray or other methods are considered. Manufacturing precision requirements of this structure are though higher than in the case of slotted spring loaded probes (FIGS. 9 to 11), but lesser than in the case of slanted slots and solid probes (FIGS. 5 to 8). The RF behaviour of said solid probes in vertically slotted airlines is similar to the slotted probes but the resonance frequency is higher, their application is thus recommended for high frequency tuners.

Resonant probes with similar RF behaviour can be made also for parallel plate airlines (slablines). Two such structures are shown in FIGS. 15 and 16. The probe (77) of FIG. 15 is spring loaded by cutting a hole (93) and a slot (82) and establishing a continuous and reliable ground contact (83) with the slabline (80). Two narrow vertical gaps are left, on both sides of the probe (78, 79) over a certain length (92). The length of said gaps does not change when the probe moves vertically (84), which means that the associated inductance is constant. The resonance frequency changes (increases) only through the change (reduction) in coupling capacitance between the probe (77) and the central conductor (81) when the probe moves away of the central conductor.

Ian alternative structure of resonant probes for slablines is shown in FIG. 16: Here the probe (85) is solid and the ground contact with the slabline (86) is capacitive (88, 89). The length of the vertical gaps (94, 95) is fixed and does not change when the probe moves vertically (90). Said capacitive contact is established as in the structure of FIG. 12, through anodization or dielectric coating. As in the case of FIG. 15, the resonance frequency will increase only through reduction of said coupling capacitance between central conductor (87) and probe (85).

In order to control the bandwidth of said series resonances of the probes the two side gaps (96, 97) are made different (FIG. 17). In this case the lead inductance between the tail of said probe and ground is different in each gap and, since it is in series with the same coupling capacitance between center conductor (98, 101) and ground (99) also said resonance frequency will be different. By choosing carefully the length of said side gaps (96, 97) said resonance frequencies can be adjusted to create a reflection pattern which either partly overlaps or is distinct, depending on the application. In the specific case of FIG. 17, the probe (100) is solid and is connected with ground (99) capacitively (98, 101) using dielectric coating or anodization as described before.

Alternatively a slotted spring-loaded probe (102) can be used in a slabline structure (103), FIG. 18, in order to establish reliable and continuous sliding galvanic contact (104) between the probe (102) and ground (103). The side gaps (105, 106) are selected with different length for adjusting the resonance frequency. Return to ground (103) is through galvanic contact (104, 107) as shown before.

In practice slide screw impedance tuners may use more than a single probe in order to cover a given frequency bandwidth, each probe being designed for a given bandwidth. Typically two said probes (108, 109) can be mounted in a single mobile carriage (FIG. 19). Each said probe is mounted in a mobile carriage (110) and can be moved vertically independently through appropriate gear and electric motor control. Said carriage control and positioning through electric motors (stepper or servo motors) and control software has been known since several years [1]. The present invention of low Q resonant, capacitively coupled probes creates a capability of said tuners to avoid unwanted and uncontrolled reflection at harmonic or other frequencies. Compared with high Q, non-ground-contacting resonant probes [3] said resonant probes of the present invention allow a higher instantaneous bandwidth.

The present embodiment of this invention can easily be adapted to different dimensions of the same basic design as well as combinations of probes for various frequencies in order to target specific applications; this shall not limit the basic idea and the overall scope of the present invention, of using resonant probes in coaxial or slabline slide screw tuners in order to create a selective frequency response.

What I claim as my invention is:

1. An impedance tuner comprising an input (test) port, an output (idle) port and a low loss slotted transmission airline between said ports, said slot being parallel to the center conductor, in which one or more conductive or metallic probes are mounted on mobile carriages and can be inserted and moved to various distances from the center conductor and across the length of said airline by means of appropriate gear and remotely controlled electrical motors;

said probes having the form of cubical blocks with a concave bottom which matches axially the center conductor and being divided in two sections: one section being grounded on the walls of the slotted airline and one floating section;

said grounded section being capacitively or galvanically connected with the sidewalls of said slotted airline, and said floating section being made as a protrusion of the probe(s)' concave bottom tails inside the cavity of the slotted airline;

said probes being resonant;

said resonance being created by a capacitance and an inductance in series;

said capacitance being created by the proximity of the concave bottom part of said probe(s) and the center conductor of said slotted airline;

said inductance being created by the floating protrusion tails of the lower part of the body of said probe(s) inside the cavity of said slotted airline;

said protrusion being the non-grounded (floating) section of said probe(s)' body beyond the area where said probe (s) make capacitive or galvanic ground contact with the sidewalls of said slotted airline.

2. An impedance tuner as in claim 1, comprising two independent carriages in the same airline each said carriage holding one or more different resonant probes, each probe being dimensioned for a different frequency range.

3. An impedance tuner as in claim 1, comprising two independent carriages in the same airline with identical or similar resonant probes each.

4. A cascade of two tuners as in claim 1, each said tuner using a single resonant probe.

5. An impedance tuner as in claim 1, in which said airline is a coaxial airline with a slot, parallel to the center conductor, said slot having a trapezoidal (slanted) cross section, in which said metallic probes are inserted and make galvanic ground contact, said slot having its narrow opening towards the center of said airline.

6. A cascade of two tuners as in claim 5, each said tuner using a single resonant probe.

7. An impedance tuner as in claim 5, in which a resonant metallic probe is used, said probe being made of a solid block with a concave bottom channel, dimensioned in order to match the diameter of the center conductor and having its tails extend vertically beyond the center conductor of the airline, and having a thickness dimensioned in order to slide-fit into the slot of the airline in order to make galvanic contact with the body of said airline and having a probe length, parallel to the center conductor, dimensioned such as to cover a certain frequency band.

8. An impedance tuner as in claim 5, in which a resonant metallic probe is used, said probe being made of a block having a vertical slot and a cavity in the center, in direction of the center conductor of said airline and having a concave bottom channel, dimensioned in order to match the diameter of the center conductor and having its tails extend vertically beyond the center conductor of the airline, and a thickness dimensioned in order to slide-fit into the trapezoidal slot of the airline and a probe length, parallel to the center conductor, dimensioned such as to cover a certain frequency band, said slot serving in creating spring loaded effect of the tails of said probe and making galvanic contact with the body of said airline.

9. An impedance tuner as in claim 5, comprising two independent carriages in the same airline with different resonant probes, each dimensioned for a different frequency range.

10. An impedance tuner as in claim 5, comprising two independent carriages in the same airline with identical or similar resonant probes each.

11. An impedance tuner as in claim 1, in which said airline is a coaxial airline with a slot, parallel to the center conductor, said slot having a trapezoidal (slanted) cross section, in which said metallic probes are inserted and make galvanic ground contact, said slot having its wide opening towards the center of said airline.

12. An impedance tuner as in claim 11, comprising two independent carriages in the same airline with different resonant probes, each dimensioned for a different frequency range.

13. An impedance tuner as in claim 11, comprising two independent carriages in the same airline with identical or similar resonant probes each.

14. A cascade of two tuners as in claim 11, each said tuner using a single resonant probe.

15. An impedance tuner as in claim 1, in which said airline is a slotted coaxial airline;

the cross section of said slot being rectangular, having two lateral internal walls parallel to each other.

16. An impedance tuner as in claim 15, comprising two independent carriages in the same airline with different resonant probes, each dimensioned for a different frequency range.

17. An impedance tuner as in claim 15, comprising two independent carriages in the same airline with identical or similar resonant probes each.

18. A cascade of two tuners as in claim 15, each said tuner using a single resonant probe.

19. An impedance tuner as in claim 1, in which said airline is a parallel plate airline (slabline).

20. An impedance tuner as in claim 19, in which a resonant metallic probe is used, said probe being made of a solid block with a concave bottom channel, dimensioned in order to match the diameter of the center conductor and having its tails extend vertically beyond the center conductor of the airline, and having a thickness dimensioned in order to slide-fit into the slot of the airline in order to make capacitive contact with the body of said slabline and having a probe length, parallel to the center conductor, dimensioned such as to cover a certain frequency band, said probe being anodized or dielectrically coated.

21. An impedance tuner as in claim 19, in which a resonant metallic probe is used, said probe being made of a block having a vertical slot and a cavity in the center, in direction of the center conductor of said airline and having a concave bottom channel, dimensioned to match the diameter of the center conductor and having its tails extend beyond the center conductor of the airline, and a thickness dimensioned to slide-fit into the rectangular slot of the airline and a probe length dimensioned to cover a certain frequency band, said slot serving in creating spring loaded effect of the tails of said probe and making galvanic contact with the body of said airline.

22. An impedance tuner as in claim 19, in which a resonant metallic probe is used, said probe being made of a block having a vertical slot and a cavity in the center, in direction of the center conductor of said airline and having a concave bottom channel and a top guidance section, which slide fits into the slabline and guides the probe horizontally and vertically and a narrower bottom section dimensioned such as to leave small gaps on each side between said probe and the lateral walls of said slabline, said slot creating a spring effect between said probe and slabline for reliable galvanic ground contact between said top guidance section of said probe and the lateral walls of said slabline.

23. An impedance tuner as in claim 22, in which each lateral side gap has different height, each dimensioned to create a resonance at a different frequency band.

24. An impedance tuner as in claim 19, in which the sidewalls of said slabline are anodized or otherwise dielectrically coated.

25. An impedance tuner as in claim 24, in which a resonant metallic probe is used, said probe being made of a solid block with a concave bottom channel, dimensioned in order to match the diameter of the center conductor and having its tails being indented in order to leave a small gap between the body of said probe and the walls of said slabline and extend vertically beyond the center conductor of the slabline, and having a thickness dimensioned in order to slide-fit into the slot of the slabline, in order to make capacitive contact with the sidewalls of said slabline and having a probe length, parallel to the center conductor, dimensioned such as to cover a certain frequency band.

26. An impedance tuner as in claim 19, in which a resonant metallic probe is used, said probe being made of a solid block with a concave bottom channel, and having a top guidance section, which slide fits into the slabline and guides the probe horizontally and vertically and a narrower bottom section dimensioned such as to leave small gaps on each side between said probe and the lateral walls of said slabline, said probe being dielectrically coated or anodized so that the top guidance section makes reliable capacitive ground contact with the lateral walls of said slabline.

27. An impedance tuner as in claim 26 in which said slabline is anodized or otherwise dielectrically coated.

28. An impedance tuner as in claim 26, in which each lateral side gap has different height, each height dimensioned to create a resonance at a different frequency band.

* * * * *